(12) United States Patent
Shimizu et al.

(10) Patent No.: US 11,881,282 B2
(45) Date of Patent: Jan. 23, 2024

(54) MEMORY DEVICE WITH DETECTION OF OUT-OF-RANGE OPERATING TEMPERATURE

(71) Applicant: Micron Technology, Inc., Boise, ID (US)

(72) Inventors: Yui Shimizu, San Jose, CA (US); Manik Advani, Fremont, CA (US); Michele Piccardi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 23 days.

(21) Appl. No.: 17/688,158

(22) Filed: Mar. 7, 2022

(65) Prior Publication Data

US 2023/0063585 A1     Mar. 2, 2023

Related U.S. Application Data

(60) Provisional application No. 63/237,827, filed on Aug. 27, 2021.

(51) Int. Cl.
*G11C 7/04*     (2006.01)
*G11C 7/10*     (2006.01)

(52) U.S. Cl.
CPC .............. *G11C 7/04* (2013.01); *G11C 7/109* (2013.01); *G11C 7/1063* (2013.01)

(58) Field of Classification Search
CPC ......... G11C 7/04; G11C 7/1063; G11C 7/109; G11C 16/3418
See application file for complete search history.

(56) References Cited

U.S. PATENT DOCUMENTS

| | | | |
|---|---|---|---|
| 7,039,150 B1 * | 5/2006 | Drori .................. | H02J 7/00036 375/377 |
| 2020/0111529 A1 * | 4/2020 | Shin ....................... | G11C 16/28 |
| 2021/0271615 A1 * | 9/2021 | Yamamoto .......... | G06F 13/1689 |
| 2022/0172772 A1 * | 6/2022 | Lee ........................ | G11C 7/04 |

* cited by examiner

*Primary Examiner* — Sultana Begum
(74) *Attorney, Agent, or Firm* — Lowenstein Sandler LLP (57) ABSTRACT

A memory device including a memory die including an internally-powered thermometer to determine a first measured operating temperature value of the memory die; detect the first measured operating temperature value satisfies one of a first condition or a second condition; and generate a first signal indicating an out-of-range operating temperature of the memory die in response to one of the first condition or the second condition being satisfied by the first measured operating temperature value. The memory die also including an externally-powered thermometer to: determine a second measured operating temperature value of the memory die; detect the second measured operating temperature value satisfies one of the first condition or the second condition; and generate a second signal indicating the out-of-range operating temperature of the memory die in response to one of the first condition or the second condition being satisfied by the second measured operating temperature value.

18 Claims, 7 Drawing Sheets

MEMORY DEVICE WITH DETECTION OF OUT-OF-RANGE OPERATING TEMPERATURE

CROSS-REFERENCE TO RELATED APPLICATION

This application claims the benefit of U.S. Provisional Application No. 63/237,827, titled "Memory Device with Detection of Out-Of-Range Operating Temperature of a Memory Die," filed Aug. 27, 2021, the entire disclosure of which is incorporated herein by reference.

TECHNICAL FIELD

Embodiments of the disclosure relate generally to memory sub-systems, and more specifically, relate to a memory device with management of operation for out-of-range operating temperature of a memory die.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Aspects of the present disclosure are directed to a memory sub-system including a memory device with a memory die having multiple thermometers to monitor an operating temperature of the memory die. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more dies. Each memory die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A host system may initiate a memory access operation (e.g., a program operation, read operation, erase operation) associated with the memory array of the one or more memory dies of the memory device. To ensure proper operation during execution of the memory access operations, the memory device is designed with an acceptable operating temperature (e.g., a temperature range) where the memory device operates and functions properly and in accordance with the design specifications. If the memory device experiences an operating temperature that is outside of the acceptable operating temperature range (e.g., 0° C. to 70° C.), operation of the memory device is negatively impacted. In this regard, if the memory device is operating outside of the acceptable temperature range, the data associated with the one or more memory access operations can be corrupted. For example, if the memory device is executing a read operation while operating outside of the acceptable temperature range, the data that is read and returned to the host system can be incorrect or inaccurate.

In certain applications or implementations in certain host systems where operation of the memory device is critical, the corruption of the data can present a significant risk. For example, a memory device implemented within an automobile can be responsible for critical functionality (e.g., an auto-pilot feature) which can pose a serious risk to the automobile's operator if the memory device is operating outside of the acceptable temperature range (e.g., experiencing data corruption in connection with memory access operations). Furthermore, the memory device can be implemented in a wide variety of different applications and host systems having a wide range of different environmental temperatures that impact the operating temperature of the memory device. For example, memory devices implemented in an automobile can be exposed to a wide range of environmental temperatures based on the automobile's geography. In such instances, it is critically important to detect when the memory device is operating outside of the acceptable temperature range, due to, for example, environmental temperature conditions. Furthermore, measuring the environmental temperature does not provide sufficient information to determine the impact on the operating temperature of the memory device or the impact on the reliability or accuracy of the data processed by the memory device.

In some instances, an internally-powered thermometer on the memory die is used to detect the operating temperature of the memory die. However, since the thermometer is powered internally, when the operating temperature of the memory die is outside of the acceptable range (e.g., too high or too low), operation of the internal voltage supply also become unstable and provides an incorrect voltage level to the thermometer. Accordingly, if the internal voltage level is incorrect, the operation of the internally-powered thermometer is negatively impacted, leading to incorrect temperature measurements. As a result, the use of a single internally-powered thermometer fails to accurately measure the operating temperature due to instability and unreliability in the operation of both the internal voltage supply and thermometer due to influences of the out-of-range operating temperature of the memory die.

Aspects of the present disclosure address the above and other deficiencies by implementing a memory device having one or more memory dies including a set of thermometer circuits including a first thermometer circuit powered by an internal supply and one or more thermometer circuits powered by one or more external supplies to detect or measure an operating temperature of the memory die and generate a flag or alert signal (also referred to as a "temperature flag signal") indicating when the operating temperature is outside of the acceptable temperature range (e.g., an out-of-range temperature). In an embodiment, the internally-powered thermometer and one or more dedicated externally-powered thermometers each measure the memory die temperature associated with a memory die (also referred to as a "measured temperature"). The measured temperature is compared to one or more threshold temperature levels (e.g., a minimum acceptable operating temperature and a maximum acceptable operating temperature of an acceptable operating temperature range) to determine whether the measured temperature is within the acceptable range or outside of the acceptable range. In an embodiment, the one or more thermometers generate a temperature flag signal in response to determining the measured temperature is outside of the acceptable operating temperature range (e.g., lower than the minimum temperature threshold level or higher than the maximum temperature threshold level). In an embodiment, the externally-powered thermometer is coupled directly to an external power supply pad (e.g., Vccp). In an embodiment, the externally-powered thermometer is not coupled to the Vccr line or the voltage regulator.

In an embodiment, the local media controller receives the temperature flag signal from the one or more thermometers and provides the temperature flag signal to the memory sub-system controller in communication with the host system controller to indicate the detection of the out-of-range operating temperature of a memory die to the host system. In another embodiment, the memory device includes a dedicated pad or pin to receive the temperature flag signal, where the dedicated pad is "directly" detectable by the memory sub-system controller. In an embodiment, the temperature flag signal enables the host controller to execute one or more responsive actions. For example, the responsive action can include terminating an on-going operation (e.g., a read operation, a write operation, an erase operation, etc.), switch to a redundant memory system, discard the related data provided by the out-of-range memory die, etc.

Advantageously, the internally-powered thermometer and one or more externally-powered thermometers provide a redundant system to detect an out-of-range operating temperature of the memory die and provide a corresponding flag signal to alert the host system. According to embodiment, any of the set of redundant thermometers can generate a flag signal in response to detecting an out-of-range operating temperature of the memory die.

Figure 1:
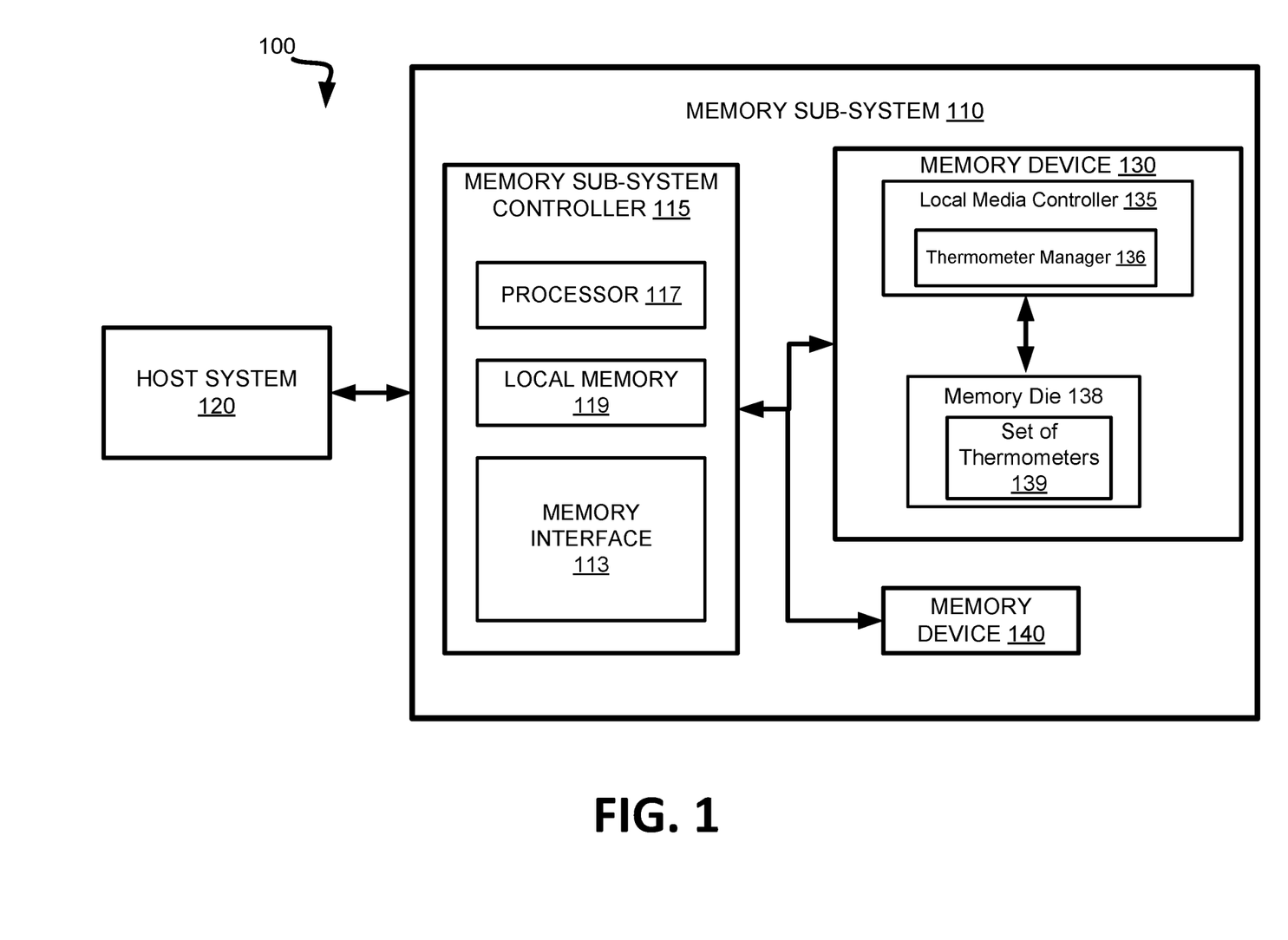
FIG. 1 illustrates an example computing system that includes a memory sub-system, in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In an embodiment, the memory device 130 includes a memory die 138 including a set of thermometers 139 (e.g., thermometer circuits). In an embodiment, the set of thermometers 139 includes a first thermometer circuit powered by an internal supply and one or more thermometer circuits powered by one or more external supplies to detect or measure an operating temperature of the memory die and generate a flag or alert signal (also referred to as a "temperature flag signal") indicating when the operating temperature is outside of the acceptable temperature range (e.g., an out-of-range temperature). In an embodiment, the temperature flag signal can be provided to a thermometer manager 136 of the local media controller 135. The thermometer manager 136 is configured to provide an indication of the temperature flag signal to the memory sub-system controller 115 to alert the host system of the out-of-range operating temperature of the memory die. In an embodiment, a dedicated "extra" pad or pin can be added to the memory device 130 that is directly accessible by the memory sub-system controller 115. The temperature flag signal can be transmitted via the dedicated pad to the memory sub-system controller 115. For example, when a temperature flag signal is generated by one or more of the set of thermometers, a voltage of the dedicated pad can be set to a low voltage level (e.g., 0V) and the memory sub-system controller 115 can detect the low voltage level of the dedicated pad and alert the host system of the out-of-range operating temperature. Aspects of the set of thermometers 136 and thermometer manager 136 are described in greater detail below with respect to FIGS. 3A-7.

Figure 2:
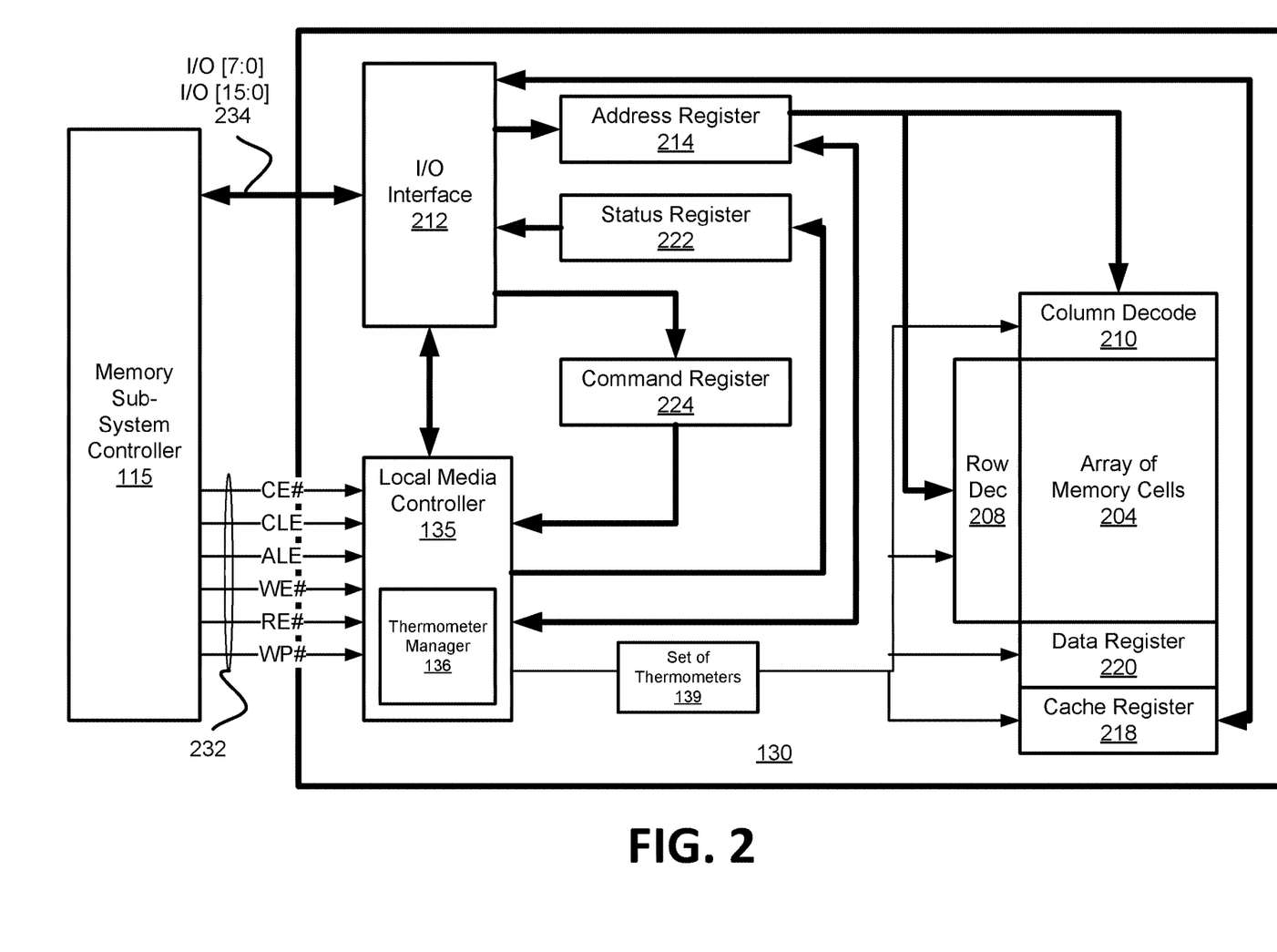
FIG. 2 is a block diagram of a memory device in communication with a memory sub-system controller of a memory sub-system, in accordance with some embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 204 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. According to embodiments, the I/O control interface 212 manages communications between the local media controller 135 and a respective memory die including an array of memory cells 204. An address register 214 is in communication with I/O control circuitry 212 and row decode circuitry 208 and column decode circuitry 210 to latch the address signals prior to decoding. A command register 224 is in communication with the I/O interface 212 and local media controller 135 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses. In one embodiment, local media controller 135 includes instructions which can be executed in connection with the operations and functions of the set of thermometers 1396 and the thermometer manager 136, as described herein.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a program operation (e.g., write operation), data may be passed from the cache register 218 to the data register 220 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 232 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at one or more of the I/O control interfaces 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2. Additionally, while specific I/O pins are described in accordance with popular conventions for receipt and output of the various signals, it is noted that other combinations or numbers of I/O pins (or other I/O node structures) may be used in the various embodiments.

Figure 3A:
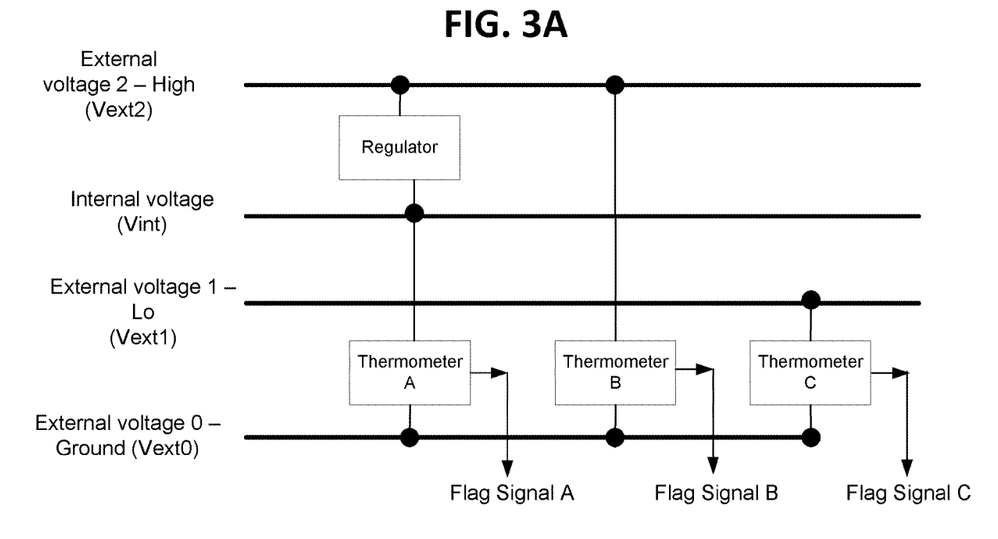
FIG. 3A is a schematic illustration of an example memory die including a set of thermometers to monitor an operating temperature of the memory die, in accordance with embodiments of the present disclosure.
Figure 3B:
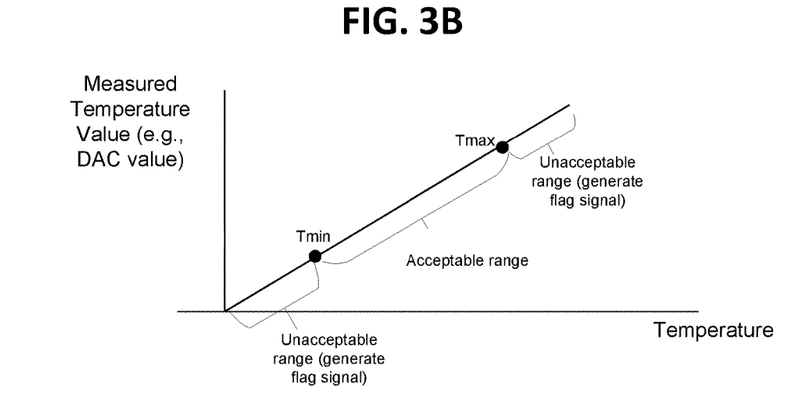
FIG. 3B is a graphical representation of a measured temperature value monitored by a set of thermometers to identify an out-of-range operating temperature of a memory die, in accordance with embodiments of the present disclosure.

FIG. 3A is a schematic illustration of an example memory die having a set of multiple thermometers (Thermometer A, Thermometer B, and Thermometer C) powered by respective power supplies. In an embodiment, the set of thermometers includes a first thermometer (Thermometer A) powered by an internal voltage supply and one or more dedicated thermometers (e.g., thermometer B and thermometer C) powered by a respective external voltage supply provided by the host system. In the embodiment shown in FIG. 3A, the set of thermometers of the memory die includes the internally-powered thermometer (Thermometer A) and receives two externally-powered thermometers (e.g., Thermometer B and/or Thermometer C) having respective external power supplies (e.g., Thermometer B is supplied by external voltage 2 and Thermometer C is supplied by external voltage 1). Although FIG. 3A shows two dedicated externally-powered thermometers, the memory die may include one externally-powered or dedicated thermometer (e.g., Thermometer B or Thermometer C) or multiple externally-powered or dedicated thermometers (e.g., Thermometer B and Thermometer C, as shown in FIG. 3A).

In the embodiment shown in FIG. 3A, the memory die includes an internal voltage supply (Vint) (e.g., approximately 2V) to power Thermometer A and receives multiple externally-supplied voltage levels to power the one or more dedicated thermometers of the memory die. In the embodiment shown in FIG. 3A, the memory die is provided with external voltage 0 ($Vext_0$) (e.g., ground voltage of approximately 0V); external voltage 1 ($Vext_1$) (e.g., approximately 1.2V), and external voltage 2 ($Vext_2$) (e.g., approximately 2.5V). In an embodiment, $Vext_1$ represents a voltage level required to perform data transfer (Input/Output) to and from the memory die. In an embodiment, $Vext_0$ is a ground voltage level (e.g., approximately 0V), $Vext_1$ is a low voltage level (e.g., approximately 1.2V), and $Vext_2$ is a high voltage level (e.g., approximately 2.5V). In an embodiment, the internally-powered thermometer A can receive a voltage supply that is regulated by a regulator, as shown in FIG. 3A. In an embodiment, the one or more externally-powered thermometers (e.g., Thermometer B and/or Thermometer C) is directly coupled to an external power supply pad (e.g., a power supply pad associated with one of $Vext_1$ or $Vext_2$). In an embodiment, the one or more externally-powered thermometers are not coupled to the internal voltage supply (Vint) or the voltage regulator.

In an embodiment, the set of thermometers are configured to periodically measure the operating temperature of the memory die. In an embodiment, the measured temperature value can be represented by a DAC value, where each DAC value corresponds to an operating temperature, as shown in the graphical representation in FIG. 3B. In an embodiment, an acceptable operating temperature range is established including a minimum acceptable operating temperature (Tmin) and a maximum acceptable operating temperature (Tmax). In an embodiment, the Tmin and Tmax may be defined or set as part of a product specification or product requirements.

In an embodiment, a measured temperature value is compared to a first threshold value corresponding to Tmin and a second threshold value corresponding to Tmax to determine if the measured temperature value (e.g., a DAC value corresponding to the operating temperature) is within the acceptable range or outside of the acceptable range. In an embodiment, each of the set of thermometers generate a temperature flag signal in response to a determination that the measured operating temperature of the memory die is outside of the acceptable range. In the example shown in FIG. 3A, Thermometer A generates flag signal A, Thermometer B generates flag signal B, and Thermometer C generates flag signal C in response to detecting an out-of-range operating temperature.

Figure 4:
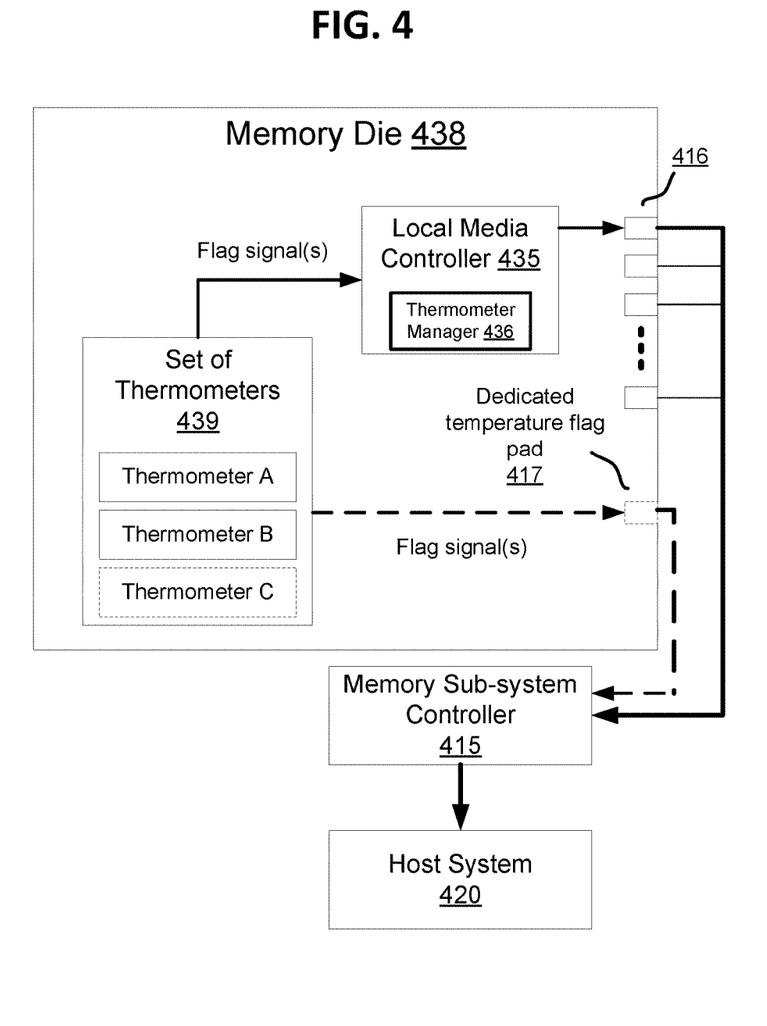
FIG. 4 is a schematic illustration of an example memory device including a memory die including multiple thermometers to generate respective flag signals associated with detection of an out-of-range operating temperature of the memory die, in accordance with embodiments of the present disclosure.

FIG. 4 is a schematic illustration of a memory die 438 including a set of thermometers 439 including a first internally-powered thermometer (Thermometer A) and one or more externally-powered thermometers (e.g., Thermometer B and/or Thermometer C). In the example shown, the set of thermometers 439 includes Thermometer A and Thermometer B and optionally includes Thermometer C (as denoted by the dashed lines).

In an embodiment, each thermometer periodically determines the measured temperature value (e.g., DAC value) and compares the measured temperature value to the threshold temperature values (e.g., a first DAC value corresponding to Tmin and a second DAC value corresponding to Tmax). In view of the comparison, the thermometers determine whether the measured temperature value is within the acceptable range or the unacceptable range. If the measured temperature value is within the unacceptable range (e.g., above Tmax or below Tmin), the one or more thermometers generates a flag signal. As shown in FIG. 3A, Thermometer A is configured to generate flag signal A, Thermometer B is configured to generate flag signal B, and Thermometer C is configured to generate flag signal C. In an embodiment, since the thermometers may operate differently from one another (e.g., in view of having different voltage supplies), one or more of the thermometers may generate a flag signal in response to a determination that the measured temperature is in an unacceptable range.

In an embodiment, the one or more flag signals generated by one or more of the thermometers of the set of thermometers 439 are communicated to a local media controller 435 of the memory die 438. In an embodiment, the local media controller 435 can include a thermometer manager 436 to process the one or more flag signals and provide a corresponding signal to a memory sub-system controller 415 to alert indicating an out-of-range operating temperature of the memory die 438 to a host system 420. In an embodiment, the local media controller 435 can provide the signal to the memory sub-system controller 415 using a pad or pin 416 of the memory die 438 that is monitored by the memory sub-system controller 415.

In another embodiment, a dedicated or "extra" pad 417 can be optionally provided (e.g., as denoted by the dashed lines of the pad and corresponding communication path of the flag signal) which receives the one or more flag signals from one or more thermometers of the set of thermometers 439 for "direct" communication to the memory sub-system controller 415 to provision to the host system 420. In this embodiment, the memory sub-system controller 415 can monitor the dedicated pad 417 and detect the flag signal. For example, the generation of the flag signal can cause a voltage level associated with the dedicated pad to go to approximately 0V, which is monitored and detected by the memory sub-system controller 415. In this example, the memory sub-system controller 415 can detect the approximately 0V voltage level of the dedicated pad 417 to determine the flag signal has been generated and send a corresponding alert to the host system 420.

In another embodiment, a ZQ calibration pad (e.g., a pad used to calibrate output driver's output impedance and on-die termination values across changes in process, voltage, and temperature) can be shared and used for the flag signal. In this embodiment, instead of a dedicated pad, the flag signals are provided to the shared ZQ calibration pad for communication with the memory sub-system controller 415.

In an embodiment, the host system 420 can receive the flag signal alert indicating that the out-of-range operating temperature of the memory die 438 (e.g., either via the local media controller 435 or "directly" via the dedicated pad) and execute a corresponding action. In an embodiment, the action executed by the host system can include, but is not limited to, terminating an on-going memory access operation associated with the memory die 438. In an embodiment, all thermometers (e.g., the internally-powered thermometer and one or more externally-powered thermometer periodically measure the operating temperature of the memory die and compare the minimum and maximum threshold levels to achieve redundant out-of-range operating temperature detection and corresponding signal generation to alert the host system.

In an embodiment, each thermometer generates a value corresponding to the measured temperature (also referred to as the "measured temperature value"). In an embodiment, each thermometer includes a digital-to-analog converter (DAC) to generate a DAC value representing the measured temperature, where the DAC value and the measured temperature are correlated (e.g., the DAC value increases as the operating temperature of the memory die increases and the DAC value decreased as the operating temperature of the memory die decreases). The measured DAC value can be compared to one or more threshold levels (e.g., a first DAC value corresponding to a minimum temperature (Tmin) of the acceptable temperature range and a second DAC value corresponding to a maximum temperature (Tmax) of the acceptable temperature range) to determine if the measured temperature is within the acceptable range or outside of the acceptable range. As noted, if the measured operating temperature of the memory die is outside of the acceptable range, the one or more thermometers generate the temperature flag signal to be provided to the host system. In an embodiment, the temperature flag signal can be provided directly to the host system (e.g., via the use of an extra pad provided on the memory die) or via the local media controller.

In an embodiment, at a first time during a power-on operation of the memory die, the operating temperature of the memory die is determined by the set of thermometers to be within the acceptable operating temperature range, but at second time following the power-on event, the operating temperature of the memory die is determined to be outside of the acceptable temperature range (e.g., due to a change in the operating temperature due to the execution of one or more memory access operations) by one or more of the thermometers. In response to the detection of the out-of-range operating temperature by one of the thermometers, the thermometer detecting the condition (e.g., determining a measured operating temperature that is below the minimum acceptable temperature level or determining a measured operating temperature that is above the maximum acceptable temperature level) generates a corresponding temperature flag signal. In an embodiment, the temperature flag signal can be provided to a local media controller (e.g., local media controller 435 of FIG. 4) or a dedicated temperature flag pad. In an embodiment, if the local media controller 435 receives or detects the signal, the local media controller communicates the signal to the host system via the memory sub-system controller.

In an embodiment, at a first time during a power-on operation of the memory die, the operating temperature operating temperature of the memory die is determined to be outside of the acceptable temperature range by one or more of the thermometers. In response to the detection of the out-of-range operating temperature by one of the thermometers, the thermometer detecting the condition generates the corresponding temperature flag signal. In an embodiment, the out-of-range temperature (e.g., a measured temperature that is below the Tmin or above the Tmax of the acceptable temperature range) can be detected by the internally-powered thermometer (e.g., thermometer A of FIG. 3A) or an externally-powered thermometer (e.g., thermometer B or thermometer C of FIG. 3A).

In an embodiment, the temperature flag signal can be provided to the local media controller or to the dedicated temperature flag pad that is monitored by the memory sub-system controller. In an embodiment, in response to the detection of the signal by the local media controller 435, information relating to the signal is provided to the host system. In an embodiment, the host system can execute an action responsive to being alerted to the out-of-range operating temperature of the memory die.

Figure 5A:
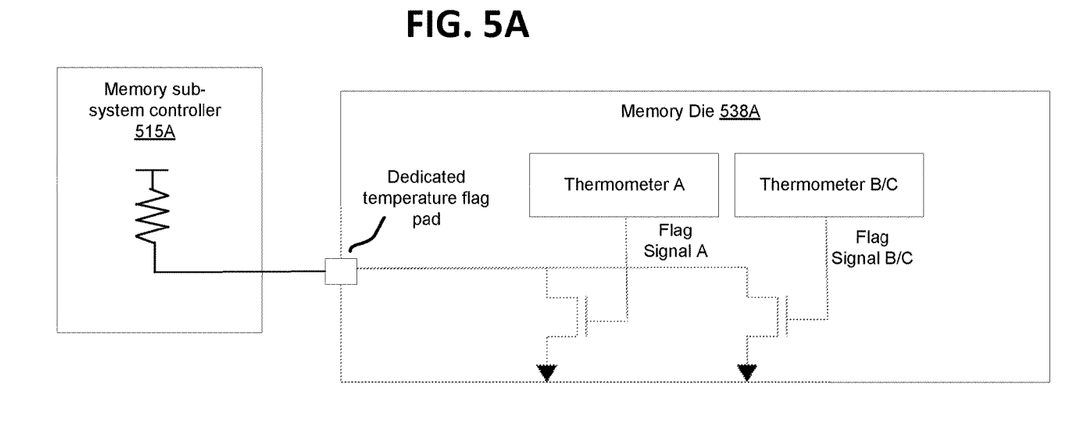
FIGS. 5A and 5B are schematic illustrations example memory devices including memory die having multiple thermometers and associated circuits to generate a flag signal associated with detection of an out-of-range operating temperature of the memory die, in accordance with embodiments of the present disclosure.
Figure 5B:
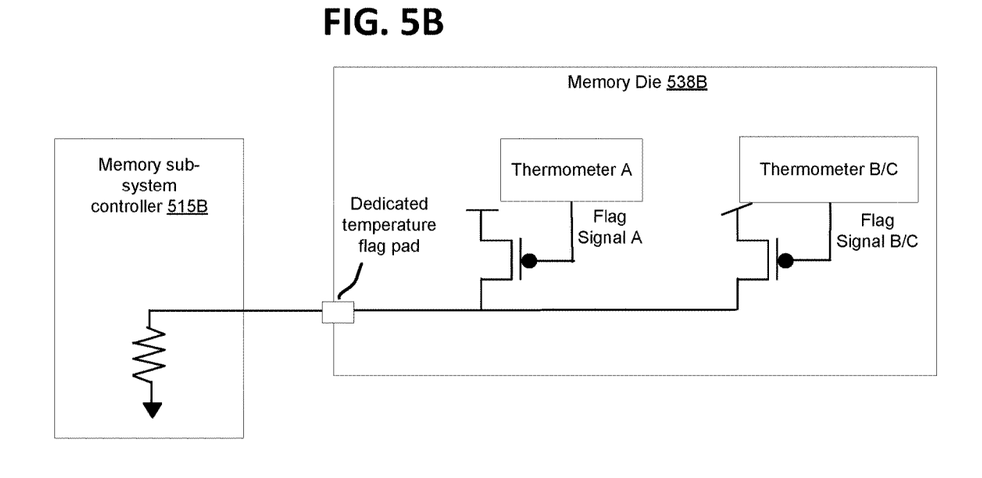

FIGS. 5A and 5B are schematic illustrations of an example memory die 538A, 538B including multiple thermometers and related example circuitry configured to generate and transmit temperature flag signals to a dedicated temperature flag pad monitored by a memory sub-system controller 515A, 515B. In an embodiment, as shown in FIG. 5A, the memory die 538A can include a set of thermometers (e.g., Thermometer A and Thermometer B and/or Thermometer C). In an embodiment, Thermometer A is powered by an internal voltage supply and Thermometer B and/or Thermometer C are powered by an external voltage supply, as shown in FIG. 3A. Each thermometer is configured to generate a flag signal in response to determining that a measured operating temperature of the memory die 538A is outside of the acceptable temperature range (e.g., below a Tmin or above a Tmax). The flag signals can be processed by a circuit (e.g., an open drain N-type metal-oxide-semiconductor logic (NMOS) wired-OR circuit as shown in FIG. 5A) such that a dedicated temperature flag pad is caused to go to a low voltage level (e.g., approximately 0V) in response to the flag signal (e.g., either flag signal A or flag signal B or flag signal C). In an embodiment, the memory sub-system controller 515A monitors the dedicated temperature flag pad and identifies the flag signal (e.g., determines when the voltage level of the dedicated flag signal pad has gone to a low level) to alert a host system of the out-of-range operating temperature of the memory die 538A.

In the embodiment shown in FIG. 5B, the memory die 538B includes a set of thermometers (e.g., Thermometer A and Thermometer B and/or Thermometer C) including an internally-powered thermometer (e.g., Thermometer A) and one or more externally-powered thermometers (e.g., Thermometer B and/or Thermometer C). In an embodiment, each thermometer is configured to generate a flag signal in response to determining that a measured operating temperature of the memory die 538B is outside of the acceptable temperature range (e.g., below a Tmin or above a Tmax). The flag signals can be processed by a circuit (e.g., an open drain P-type metal-oxide-semiconductor logic (PMOS) wired-OR circuit as shown in FIG. 5B) such that a dedicated temperature flag pad is caused to go to a high voltage level (e.g., approximately Vint, Vext$_1$, or Vext$_2$, depending on the implementation) in response to the flag signal (e.g., either flag signal A or flag signal B or flag signal C). In an embodiment, the memory sub-system controller 515B monitors the dedicated temperature flag pad and identifies the flag signal (e.g., determines when the voltage level of the dedicated flag signal pad has gone to a high level) to alert a host system of the out-of-range operating temperature of the memory die 538B.

Figure 6:
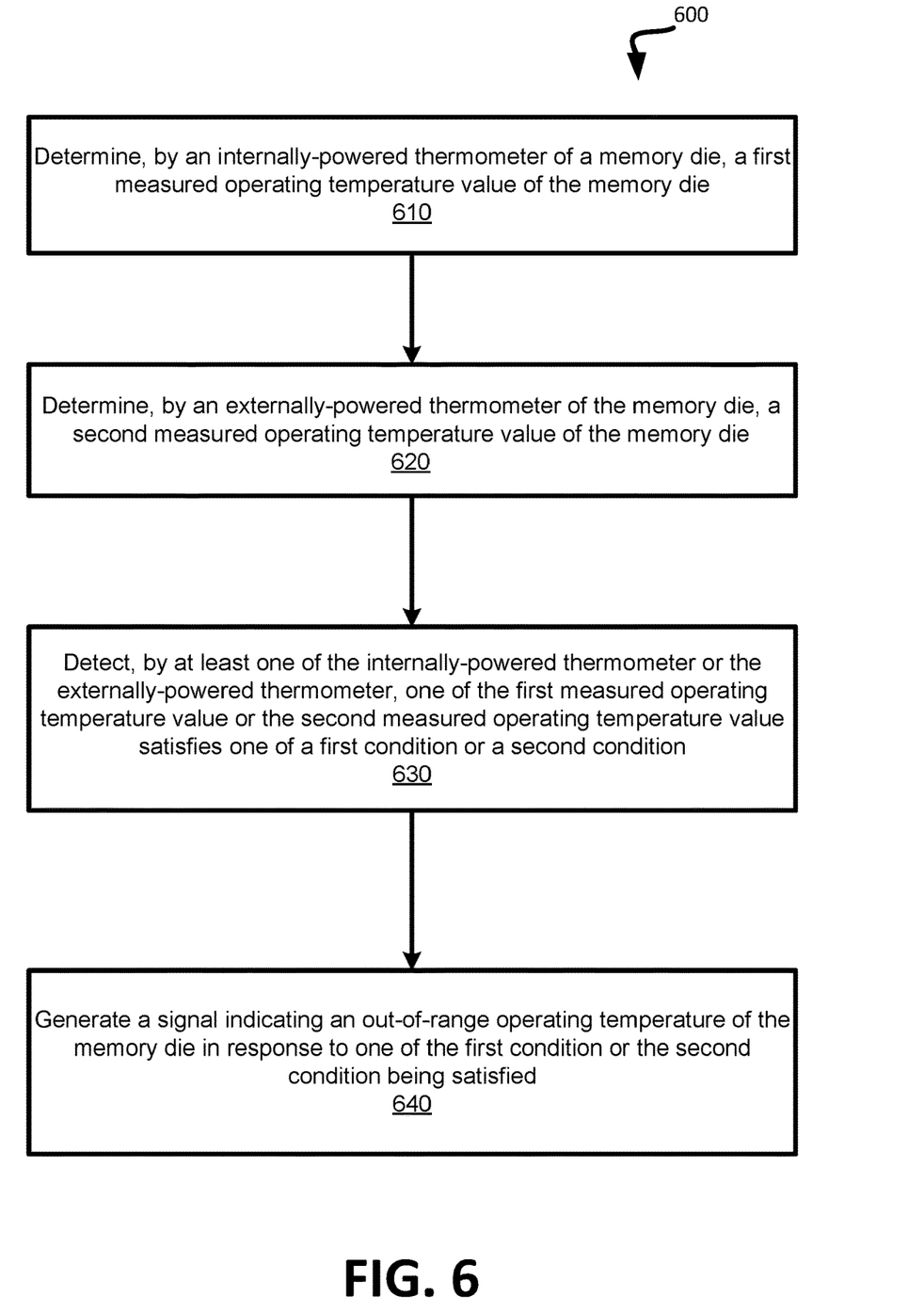
FIG. 6 is a flow diagram of an example method of generating a signal indicating an out-of-range operating temperature of a memory die including a set of thermometers, in accordance with one or more embodiments of the present disclosure.

FIG. 6 is a flow diagram of an example method of generating a flag signal indicating an operating temperature of a memory die is outside of an acceptable temperature range, in accordance with one or more embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by a thermometer manager 136 of the local media controller 135 and the set of thermometers 139 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610, a first temperature value is determined. For example, an internally-powered thermometer of a memory die can determine a first measured operating temperature value of the memory die. In an embodiment, the internally-powered thermometer (e.g., Thermometer A of FIG. 3A) is powered by an internal voltage supply (e.g., Vint of FIG. 3A) and measures an operating temperature of the memory die to determine the first measured operating temperature value.

At operation 620, a second temperature value is determined. For example, an externally-powered thermometer of the memory die can determine a second measured operating temperature value of the memory die. In an embodiment, the externally-powered thermometer (e.g., Thermometer B or C of FIG. 3A) is powered by an external voltage supply (e.g., Vext$_1$ or Vext$_2$ of FIG. 3A) and measures the operating temperature of the memory die to determine the second measured operating temperature value.

At operation 630, a first condition or second condition is detected. For example, at least one of the internally-powered thermometer or the externally-powered thermometer detects one of the first measured operating temperature value or the second measured operating temperature value satisfies one of a first condition or a second condition. In an embodiment, the first condition is satisfied if either the first measured operating temperature value or the second measured operating temperature value is below a minimum temperature threshold (Tmin) of an acceptable operating temperature range. In an embodiment, the second condition is satisfied if either the first measured operating temperature value or the second measured operating temperature value is above a maximum temperature threshold (Tmax) of the acceptable operating temperature range.

At operation 640, a signal is generated. For example, at least one of the internally-powered thermometer or the externally-powered thermometer can generate a signal indicating an out-of-range operating temperature of the memory die in response to one of the first condition (e.g., an operating temperature that is below the minimum acceptable operating temperature) or the second condition (e.g., an operating temperature that is above the maximum acceptable operating temperature) being satisfied. In an embodiment, the signal (e.g., flag signal A, flag signal B and/or flag signal C of FIG. 3A) can be communicated to processing logic of a local media controller 135 (e.g., a thermometer manager 136 of the local media controller 135 of FIG. 1). The local media controller 135 can, in turn, communicate the signal to a memory sub-system controller (e.g., memory sub-system controller 415 of FIG. 4) to alert a host system of the out-of-range operation of the memory die. In an embodiment, the host system can be configured to execute an action (e.g., terminate an on-going operation associated with the memory die, discard data returned by the memory die in association with a read operation, switch to a redundant memory system including another memory die, etc.) in response to alert associated with the out-of-range temperature detection.

Figure 7:
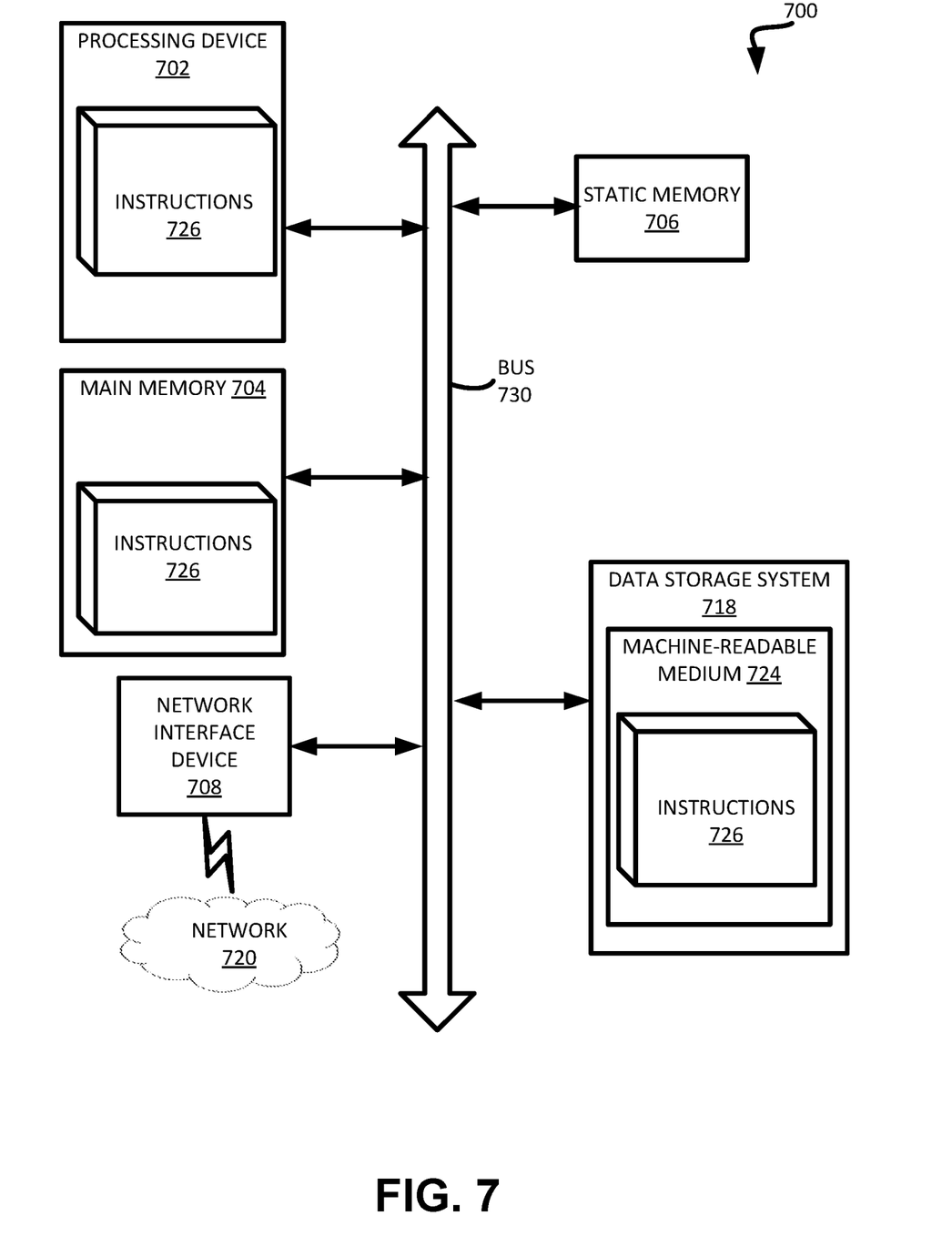
FIG. 7 is a block diagram of an example computer system in which embodiments of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to execute instructions 726 to perform operations corresponding to the management of signals indicating an out-of-range operating temperature of a memory die generated by a set of thermometers 139 communicatively coupled to a thermometer manager 136 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium, such as a non-transitory computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to the multiple thermometers 139 and thermometer manager 136 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
   a memory die comprising:
      an internally-powered thermometer comprising a first temperature measurement circuit to perform first operations comprising:
         measuring a first measured operating temperature value of the memory die;
         detecting the first measured operating temperature value satisfies one of a first condition or a second condition; and
         generating a first signal indicating an out-of-range operating temperature of the memory die in response to one of the first condition or the second condition being satisfied by the first measured operating temperature value; and
      an externally-powered thermometer comprising a second temperature measurement circuit to perform second operations comprising:
         measuring a second measured operating temperature value of the memory die;
         detecting the second measured operating temperature value satisfies one of the first condition or the second condition; and
         generating a second signal indicating the out-of-range operating temperature of the memory die in response to one of the first condition or the second condition being satisfied by the second measured operating temperature value.

2. The memory device of claim 1, further comprising:
   a controller operatively coupled to the internally-powered thermometer and the externally-powered thermometer, the controller to perform operations comprising:
      identifying one of the first signal or the second signal indicating the out-of-range operating temperature of the memory die; and
      providing, to a host system, an alert associated with the first signal or the second signal.

3. The memory device of claim 1, wherein the first condition is satisfied when one of the first measured operating temperature value or the second measured operating temperature value is below a minimum temperature threshold of an acceptable operating temperature range associated with the memory die; and wherein the second condition is satisfied when one of the first measured operating temperature value or the second measured operating temperature value is above a maximum temperature threshold of the acceptable operating temperature range associated with the memory die.

4. The memory device of claim 1, wherein the externally-powered thermometer receives a first external voltage level from a voltage source of a host system.

5. The memory device of claim 1, wherein the memory die further comprises a dedicated pad to receive one or more of the first signal or the second signal indicating the out-of-range operating temperature of the memory die.

6. The memory device of claim 5, wherein the dedicated pad is monitored by a memory sub-system controller of the memory device to detect one or more of the first signal or the second signal indicating the out-of-range operating temperature of the memory die.

7. The memory device of claim 1, wherein the memory die further comprises a ZQ calibration pad configured to receive one or more of the first signal or the second signal indicating the out-of-range operating temperature of the memory die.

8. The memory device of claim 1, the memory die comprising an additional externally-powered thermometer, wherein the externally-powered thermometer receives a first external voltage level from a voltage source of a host system; and wherein the additional externally-powered thermometer receives a second external voltage level from the voltage source of the host system.

9. A memory sub-system comprising:
   a memory device comprising:
      a first thermometer comprising a first temperature measurement circuit to measure a first measured operating temperature value and generate a first signal indicating an out-of-range operating temperature of the memory device, wherein the first thermometer is powered by an internal voltage source of the memory device; and
      a second thermometer comprising a second temperature measurement circuit to measure a second measured operating temperature value generate a second signal indicating the out-of-range operating temperature of the memory device, wherein the second thermometer is powered by an external voltage source of a host system; and
   control logic, operatively coupled with the first thermometer and the second thermometer, to perform operations comprising:
      receiving at least one of the first signal or the second signal; and
      transmitting, to the host system, an alert associated with the at least one of the first signal or the second signal.

10. The memory sub-system of claim 9, wherein the first signal is generated in response to determining, by the first thermometer, the first measured operating temperature value of the memory device satisfies one of a first condition or a second condition.

11. The memory sub-system of claim 10, wherein the second signal is generated in response to determining, by the second thermometer, the second measured operating temperature value of the memory device satisfies one of the first condition or the second condition.

12. The memory sub-system of claim 11, wherein the first condition is satisfied when the first measured operating temperature value or the second measured operating temperature value is below a minimum temperature threshold of an acceptable operating temperature range associated with the memory device; and wherein the second condition is satisfied when one of the first measured operating temperature or the second measured operating temperature is above a maximum temperature threshold of the acceptable operating temperature range associated with the memory device.

13. The memory sub-system of claim 9, wherein the memory device comprises a dedicated pad monitored by the control logic to receive the at least one of the first signal or the second signal.

14. The memory sub-system of claim 9, wherein, in response to the alert, the host system performs an action comprising one or more of terminating an on-going memory access operation, switching to a redundant memory sub-system, or discarding data associated with the memory device.

15. A memory device comprising:
a first thermometer comprising a first temperature measurement circuit to measure a first measured operating temperature value and generate a first signal indicating an out-of-range operating temperature of the memory device;
an internal voltage supply to provide a first voltage to power the first thermometer;
a second thermometer comprising a second temperature measurement circuit to measure a second measured operating temperature value and generate a second signal indicating the out-of-range operating temperature of the memory device, wherein the second thermometer is powered by a second voltage supplied by an external voltage supply of a host system; and
a dedicated pad to receive at least one of the first signal or the second signal, wherein the dedicated pad is monitored by a memory sub-system controller communicatively coupled to the host system.

16. The memory device of claim 15, wherein the memory sub-system controller provides an alert to the host system in response to detection of one of the first signal or the second signal.

17. The memory device of claim 15, wherein the first signal is generated in response to determining, by the first thermometer, the first measured operating temperature level of the memory device satisfies one of a first condition or a second condition.

18. The memory device of claim 17, wherein the second signal is generated in response to determining, by the second thermometer, the second measured operating temperature level of the memory device satisfies one of the first condition or the second condition.

* * * * *